United States Patent
Brady (10) Patent No.: US 7,821,046 B2
(45) Date of Patent: Oct. 26, 2010

(54) METHODS, STRUCTURES AND SYTEMS FOR AN IMAGE SENSOR DEVICE FOR IMPROVING QUANTUM EFFICIENCY OF RED PIXELS

(75) Inventor: Frederick T. Brady, Meridian, ID (US)

(73) Assignee: Aptina Imaging Corporation, George Town (KY)

( * ) Notice: Subject to any disclaimer, the term of this patent is extended or adjusted under 35 U.S.C. 154(b) by 319 days.

(21) Appl. No.: 11/741,259

(22) Filed: Apr. 27, 2007

(65) Prior Publication Data

US 2008/0265295 A1     Oct. 30, 2008

(51) Int. Cl.
*H01L 31/062* (2006.01)

(52) U.S. Cl. .............. 257/291; 257/E23.642; 257/E25.065; 438/157

(58) Field of Classification Search ............ 257/204, 257/291, E31.085, E31.12; 438/129, 73
See application file for complete search history.

(56) References Cited

U.S. PATENT DOCUMENTS

| | | | |
|---|---|---|---|
| 5,872,371 | A | 2/1999 | Guidash et al. |
| 6,339,248 | B1 | 1/2002 | Zhao |
| 6,518,085 | B1 * | 2/2003 | Wang et al. .......... 438/70 |
| 6,740,905 | B1 | 5/2004 | Kayo |
| 6,894,265 | B2 | 5/2005 | Merrill |
| 6,934,050 | B2 | 8/2005 | Merrill |
| 2005/0133825 | A1 * | 6/2005 | Rhodes et al. ......... 257/204 |
| 2006/0163618 | A1 | 7/2006 | Park |
| 2006/0255372 | A1 | 11/2006 | Patrick |
| 2007/0075338 | A1 | 4/2007 | Park et al. |

FOREIGN PATENT DOCUMENTS

| | | |
|---|---|---|
| EP | 1061572 A1 * | 12/2000 |
| EP | 1744366 | 1/2007 |
| EP | 0809299 | 11/2007 |
| JP | 61285760 | 12/1986 |
| WO | WO2005/091966 A2 | 10/2005 |
| WO | WO2005/119792 A1 | 12/2005 |

OTHER PUBLICATIONS

Holland, S.E. et al. A 200 x 200 CCD Image Sensor Fabricated On High-Resistivity Silicon. pp. 1-4. Website: www-supernova.lbl.gov/public/papers/ccd_ieee.ps.
Downing, Mark et al. Custom CCD for Adaptive Optics Applications. Society of Photo-Optical Instrumentation Engineers, 2006. pp. 1-15. Published in SPIE conference Orlando, May 2006. Website: www.eso.org/projects/aot/DSM/orlando1_ccdE2V.pdf.

* cited by examiner

*Primary Examiner*—Thanh V Pham
*Assistant Examiner*—Mark A Laurenzi, III (57) ABSTRACT

A method and structure for providing a high energy implant in only the red pixel location of a CMOS image sensor. The implant increases the photon collection depth for the red pixels, which in turn increases the quantum efficiency for the red pixels. In one embodiment, a CMOS image sensor is formed on an p-type substrate and the high energy implant is a p-type implant that creates a p-type ground contact under the red pixel, thus reducing dark non-uniformity effects. In another embodiment, a CMOS image sensor is formed on an n-type substrate and a high energy p-type implant creates a p-type region under only the red pixel to increase photon collection depth, which in turn increases the quantum efficiency for the red pixels.

38 Claims, 10 Drawing Sheets

METHODS, STRUCTURES AND SYTEMS FOR AN IMAGE SENSOR DEVICE FOR IMPROVING QUANTUM EFFICIENCY OF RED PIXELS

TECHNICAL FIELD

This invention relates to semiconductor imaging devices and fabrication methods thereof and more specifically to imaging arrays and methods for forming same.

BACKGROUND

In general, a Complimentary Metal Oxide Semiconductor (CMOS) image sensor circuit includes a focal plane array of pixels, each one of the pixels includes a photo-conversion device, e.g., a photogate, photoconductor, or photodiode having an associated charge accumulation region within a substrate for accumulating photo-generated charge. Each pixel may include a transistor for transferring charge from the charge accumulation region to a diffusion node and a transistor for resetting the diffusion node to a predetermined charge level prior to charge transference. The pixel may also include a source follower transistor for receiving and amplifying charge from the diffusion node and an access transistor for controlling the readout of the pixel contents from the source follower transistor. In some arrangements, the transfer transistor is omitted and the charge accumulation region is coupled with the diffusion node.

In a CMOS image sensor, the active elements of a pixel perform the necessary functions of: (1) photon to charge conversion; (2) accumulation of image charge; (3) transfer of charge to the diffusion node accompanied by charge amplification (where a transfer transistor is used); (4) resetting the diffusion node to a known state before the transfer of charge to it; (5) selection of a pixel for readout; and (6) output and amplification of a reset signal and a signal representing pixel charge from the diffusion node. The charge at the floating diffusion node is typically converted to a pixel output voltage by the source follower output transistor.

However the CMOS image sensor is susceptible to the generation of dark current that is generally attributed to leakage in the charge collection region of the pinned photodiode, which is strongly dependent on the doping implantation conditions of the CMOS image sensor. In addition, defects and trap sites inside or near the photodiode depletion region strongly influence the magnitude of dark current generated. In summary, dark current is a result of current generated from trap sites inside or near the photodiode depletion region, surface leakage at silicon/surface interface; band-to-band tunneling induced carrier generation as a result of high fields in the depletion region; junction leakage coming from the lateral sidewall of the photodiode; and leakage from isolation corners, for example, stress induced and trap assisted tunneling.

U.S. Patent Application Publication US 2005/0133825 A1, the contents of which are incorporated herein by reference as if set forth in its entirety, discusses methods and structures for reducing dark current in an image sensor by preventing unwanted electrons from being collected in the photosensitive regions of the pixels. In US 2005/0133825 A1, dark current is reduced by providing a deep n-type region having an n-type peripheral sidewall formed in a p-type substrate region underlying a pixel array region to separate the pixel array region from a peripheral circuitry region of the image sensor.

Dark current is but one of the inherent operational challenges in CMOS image sensors, as another area of focus is maximizing the fill factor as pixel size decreases. A significant portion of the pixel area is dedicated to the support transistors (amplifier, reset, and row select), which are relatively opaque to visible light photons and cannot be utilized for photon detection. The remaining area is utilized as the photosensitive part of the pixel. Because such a small portion of the photodiode is actually capable of absorbing photons to generate charge, the fill factor or aperture of the CMOS image sensor represents only portion of the total photodiode array surface area. Low fill factors can result in a significant loss in sensitivity and a corresponding reduction in signal-to-noise ratio, leading to a limited dynamic range. Fill factor ratios vary from device to device, but in general, they range from 30 to 80 percent of the pixel area in CMOS image sensors.

Compounding the reduced fill factor problem is the wavelength-dependent nature of photon absorption, a term referred to as the quantum efficiency of CMOS image sensors. Three primary mechanisms operate to hamper photon collection by the photosensitive area: absorption, reflection, and transmission. It is common that a majority of the photodiode area may be shielded by transistors and stacked or interleaved metallic bus lines, which are optically opaque and absorb or reflect a majority of the incident photons colliding with the structures. Optimizing quantum efficiency in these CMOS image sensors is an ongoing endeavor. Furthermore, when n-type substrates are used to reduce cross-talk, red quantum efficiency is reduced as a result of the thin collection depth of the n-tub or n-type substrate.

Still another area of focus in CMOS image sensors is the desired reduction of floating body effects when n-type substrates (such as an n-tub as disclosed in U.S. Patent Application Publication US 2005/0133825 A1) are implemented under the image sensor pixel's photosensor (e.g. photodiode). Floating body effects occur when the pixel is grounded only at the edge of the array, so the pixels in the center of the array exhibit an unstable behavior. Metal wiring can be added to ground the pixels, but the additional contact can reduce fill factor and the extra metal routing can block light and thus reduce quantum efficiency.

Therefore, what is needed in the art is an image sensor which exhibits substantial photon collection depth for the red pixels, increases the quantum efficiency, reduces floating body effects, and maintains the fill factor (pixel density).

DETAILED DESCRIPTION

In the following detailed description, reference is made to the accompanying drawings, which form a part hereof, and in which is shown by way of illustration of specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on other semiconductors including silicon-germanium, germanium, or gallium-arsenide.

The term "pixel" refers to a picture element unit cell containing a photosensor and transistors for converting electromagnetic radiation to an electrical signal.

Preferred embodiments of the present disclosure provide structures and methods to improve quantum efficiency, reduce floating body effects, and add ground contacts for the red pixels while maintaining the fill factor (pixel density) in CMOS image sensors, as described below with reference to FIGS. 1A-1F and FIGS. 2C-2E.

Figure 1A:
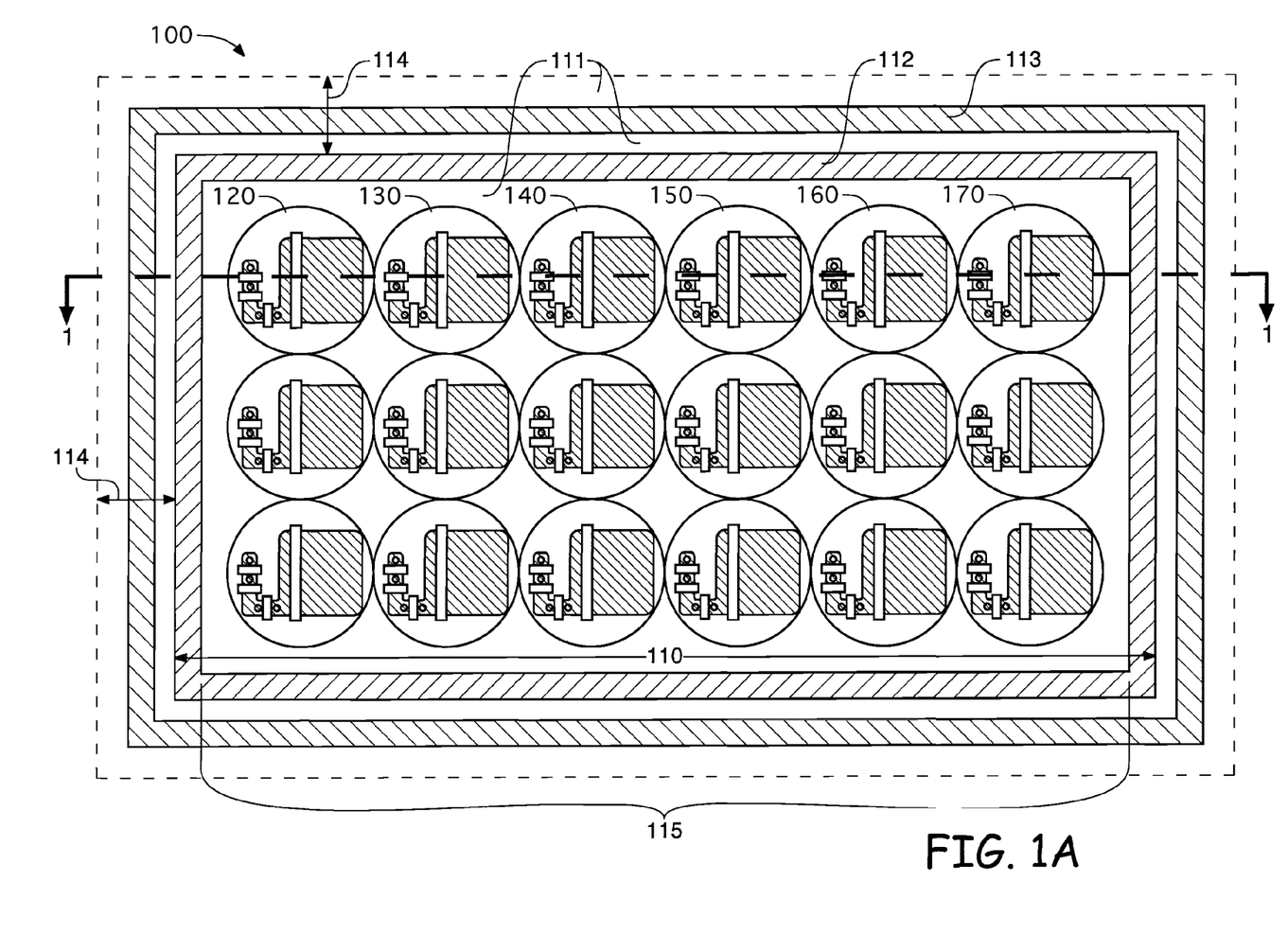
FIG. 1A is a top-down view of a semiconductor assembly comprising a segment of a CMOS image sensor array in accordance with the present disclosure.

FIG. 1A illustrates a top view of a CMOS image sensor indicated generally by reference numeral 100. CMOS image sensor 100 comprises a peripheral substrate region 114 and a pixel array substrate region 110. Field oxide regions 111 are used to isolate individual pixels as well as to isolate circuits in the peripheral substrate region 114 from the pixel array substrate region 110. A p-type conductive guard ring 112 surrounds the CMOS image sensor pixel array 115, which in turn is surrounded by an n-type conductive guard ring 113. The locations of the individual pixels are denoted by alternating green and red pixel locations 120, 130, 140, 150, 160 and 170 to assist in the discussion of each embodiment of the present disclosure. Other pixels designated to a particular color, such as blue, are assumed to be part of the pixel array substrate region 110 as well, though not specifically shown. Also, it is to be understood that the pixel array substrate region 110, depicted in FIG. 1A, is not intended to limit the size of pixel array 115, but is to serve as an illustration for practicing the concepts disclosed in the embodiments of the present disclosure.

Figure 1B:
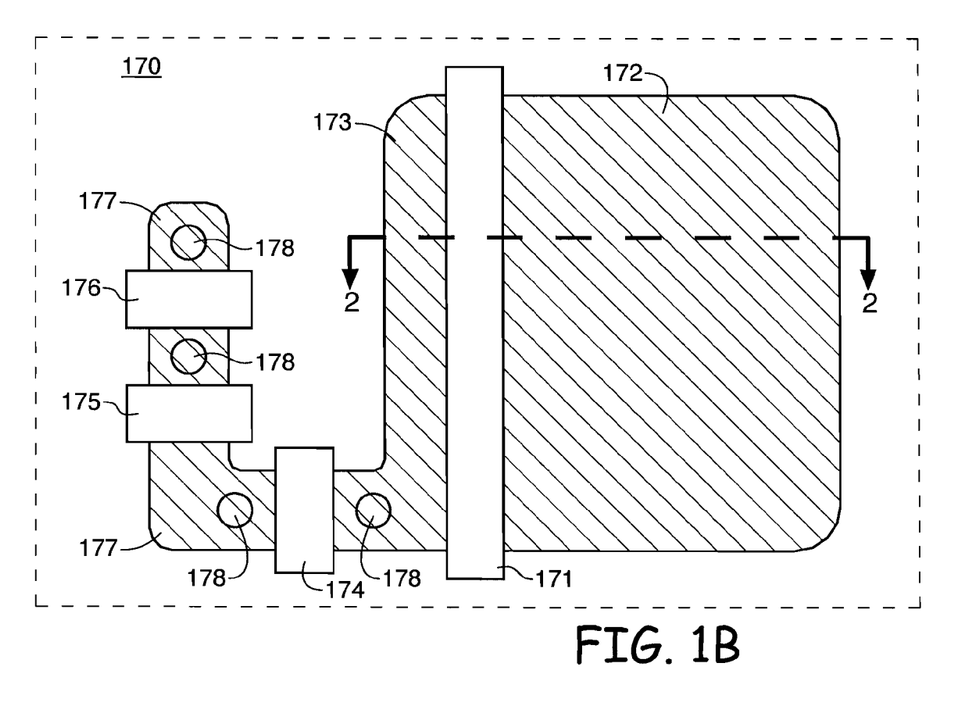
FIG. 1B is a top-down view of a semiconductor assembly comprising a segment of a single CMOS image sensor red pixel in accordance with the present disclosure.

FIG. 1B illustrates a typical layout of an individual four-transistor (4T) pixel 170, as illustrated in FIG. 1A. The CMOS image sensor red pixel 170 generally comprises a transfer gate 171 for transferring photoelectric charges generated in a photodiode region 172 to a floating diffusion region 173 acting as a sensing node, which is in turn electrically connected to the gate 175 of an output source follower transistor. A reset gate 174 is provided for resetting the floating diffusion node (or sensing node) 173 and the photodiode region 172 to a predetermined voltage in order to sense a next signal and a row select gate 176 is provided for outputting a signal from the source follower transistor to an output terminal in response to a pixel row select signal. Contact locations 178 provide for the various metal connections needed for each CMOS image sensor pixel 170 which may or may not be interconnected.

Figure 1C:
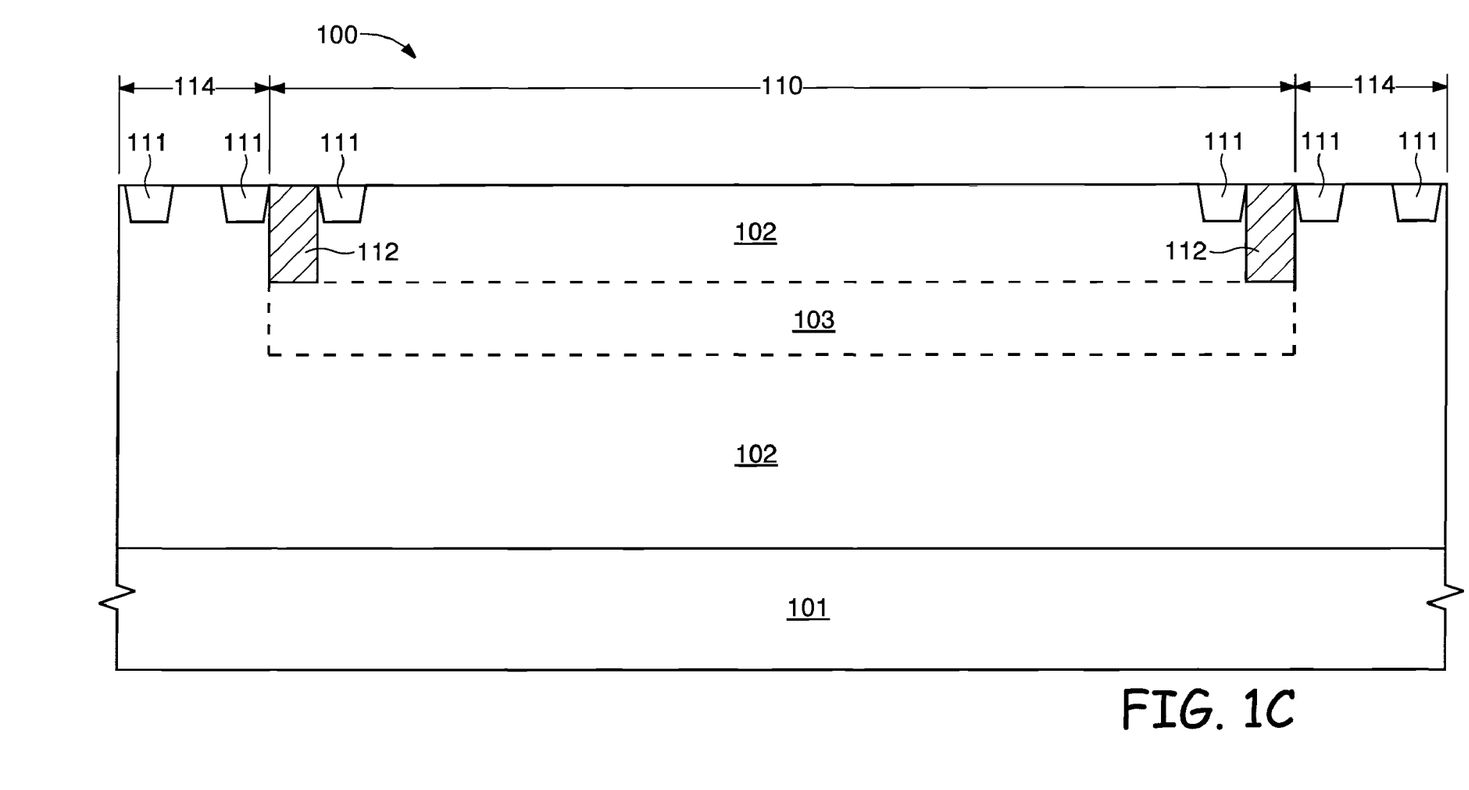
FIGS. 1C-1E illustrate cross-sectional views of a semiconductor assembly comprising a segment of a CMOS image sensor device during various stages of fabrication in accordance with a first embodiment of the present disclosure.
Figure 1D:
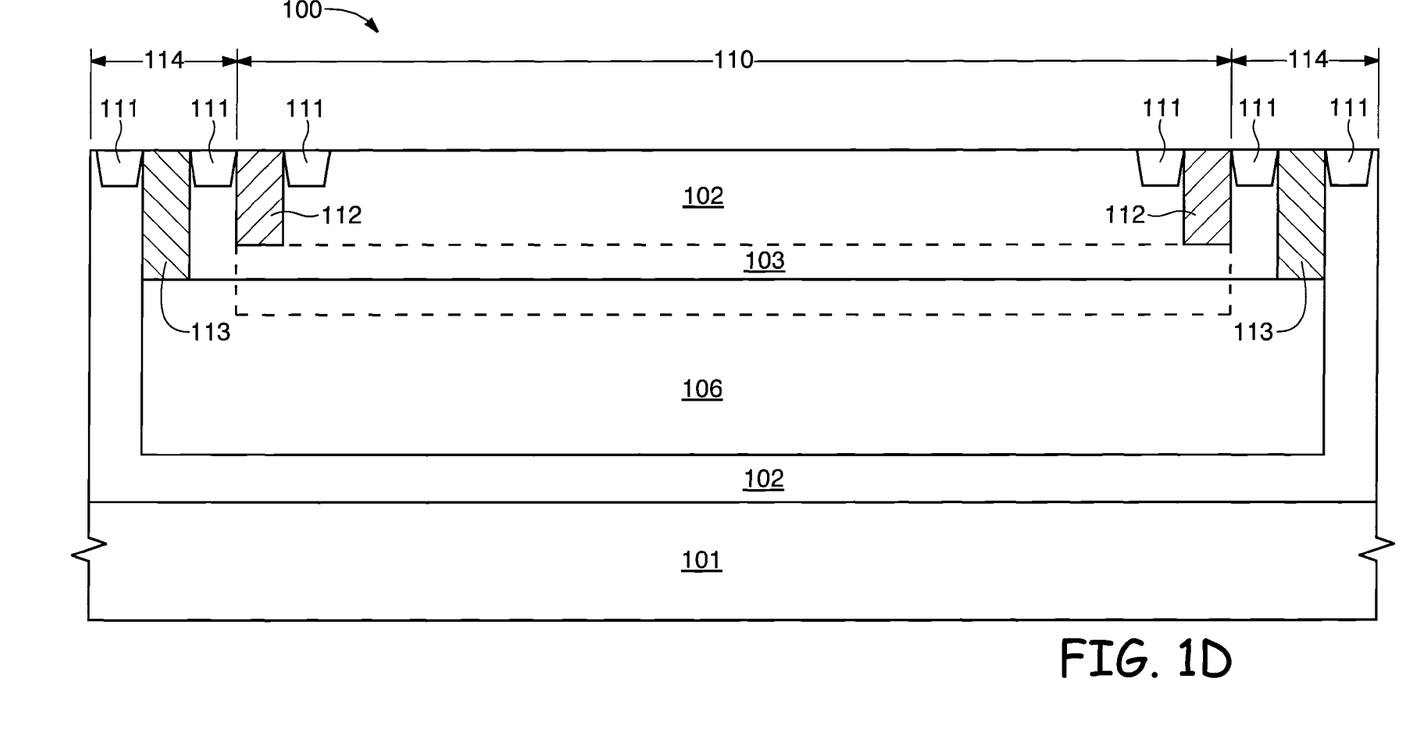
Figure 1E:
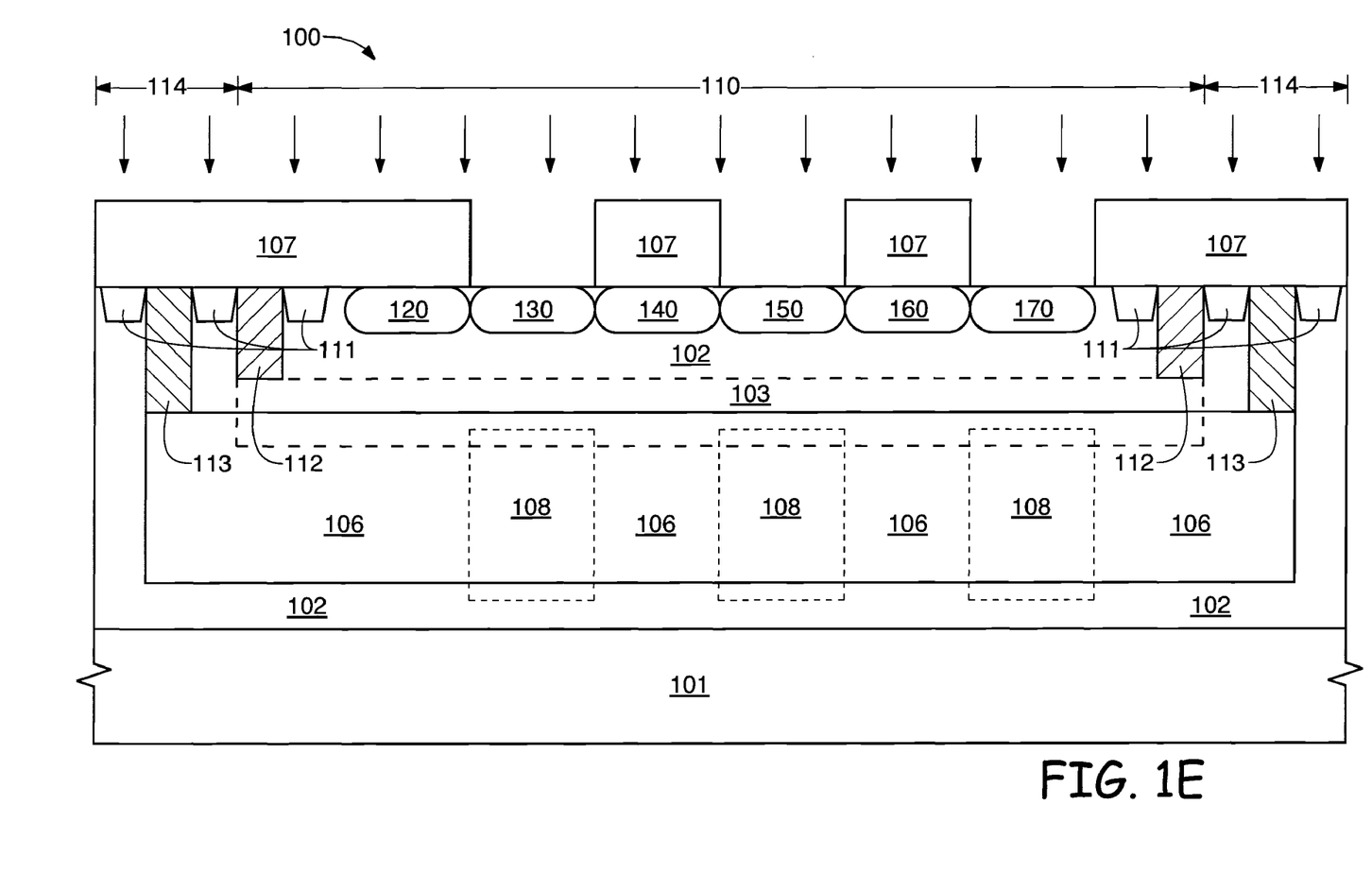

A CMOS image sensor device in accordance with the first embodiment of the present disclosure is fabricated as depicted in the cross-sectional views of FIG. 1C-1E, that correspond to the generally layout of top down view FIG. 1A and in accordance to the cross-sectional view taken along line 1-1 of FIG. 1A.

Referring now to FIG. 1C, CMOS image sensor 100 utilizes p-type substrate section 101. A p-type epitaxial material is grown in the course of epitaxial deposition and then patterned to form p-type epitaxial region 102 on p-type substrate 101 at a thickness of approximately 4 μm and doped to a p-type conductivity using, for example, boron at a concentration of approximately 7E14 atoms $cm^{-1}$.

Next, field oxide regions 111, such as by using shallow trench isolation (STI) techniques know to one skilled in the art, are formed in p-type epitaxial region 102. For example field oxide regions 111 can be formed using a conventional STI process and are typically formed by etching a trench in the substrate via a directional etching process, such as Reactive Ion Etching (RIE), or etching with a preferential anisotropic etchant. The trenches are then filled with an insulating material, for example, silicon dioxide, silicon nitride, ON (oxide-nitride), NO (nitride-oxide), or ONO (oxide-nitride-oxide). The insulating materials may be formed by various chemical vapor deposition (CVD) techniques such as low pressure chemical vapor deposition (LPCVD), high density plasma (HDP) deposition, or any other suitable method for depositing an insulating material within a trench. After the trenches are filled with an insulating material, a planarizing process such as chemical mechanical polishing is used to planarize the structure. Following the formation of field oxide regions 111, a p-type ground ring 112 is formed inside the pixel array section 110 to form a peripheral p-well wall thereabout and extends to contact the p-type epitaxial region 102 or to an p-type implant region 103, which is a p-type conductive region formed by an optional p-type implant.

Referring now to FIG. 1D, a deep n-type region (N-Tub region) 106 is formed into p-type epitaxial region 102 at a depth that sufficiently places the N-Tub region below an upper region of p-type epitaxial region 102, but in contact with p-type conductive implant region 103 (if present), using for example an n-type implant dose of approximately 5E12 atoms $cm^{-3}$. Next, an n-type sidewall (n-type guard ring) 113 is formed in the peripheral circuit region 114 that extends to the N-Tub region 106 to form an n-type region isolation structure which separates the pixel array region 110 from the peripheral circuit region 114.

Referring now to FIG. 1E, implant mask 107 is patterned so that only the red pixel locations 130, 150 and 170 are open during a subsequent implant step. Next, a p-type implant is performed to create the p-type ground contacts 108. The p-type implant must be performed such that the resulting p-type ground contacts 108 are at approximately the same depth, or preferably at a deeper depth than N-Tub region 106. One method would be to perform the implant using a higher dose than used during the N-Tub region implant so that the p-type implant will over compensate the N-Tub region 106 under the desired red pixel. For example, using a boron dose greater than 5E12 atoms $cm^{-3}$ at an energy level of around 1.4 keV, will sufficiently punch the p-type implant through N-Tub region 106 and into p-type epitaxial region 102, thus forming the desired grounding contact between an upper region of p-type epitaxial region 102 to a lower region of the p-type epitaxial region 102 through N-Tub region 106 under the red pixel locations. Also the high energy implant will increase the photon collection depth which in turn improve quantum efficiency for the red pixels without increasing the fill factor (pixel density) of CMOS image sensor.

FIG. 1E also illustrates a CMOS imager sensor structure resulting from the process steps as discussed in accordance with FIGS. 1C-1E. The CMOS image sensor structure of FIG. 1E shows a p-type substrate 101, on which a p-type epitaxial silicon material 102 is formed. A deep n-type region (N-Tub region) 106 having an n-type peripheral sidewall (N+ guard ring) 113 connecting thereto, such that at least in the pixel array substrate region 110, the N-Tub region 106 resides above the p-type substrate region 101 and deep within a p-type epitaxial region 102. The N-Tub region 106 preferably extends under the pixel array substrate region 110 and below the field oxide regions 111 that surround the pixel array substrate region 110. The N+ guard ring 113 is preferably a contiguous structure that surrounds the pixel array substrate region 110 and extends downwardly and connecting to the N-Tub region 106. The N+ guard ring 113 being connected to the N-Tub region 106 electrically isolates the pixel array region 110 from the periphery region 114.

The pixel array substrate region 110 further includes p-well implants in the form of a peripheral p-well sidewall (p-type ground ring) 112 to frame in the perimeter of the pixel array substrate region 110. The p-type ground ring 112 can be either contiguous or non-contiguous, in that it may include a plurality of local p-well implants, each of which will make contact to the p-type epitaxial region 102 or to an optional p-type implant region 103. P-type conductivity grounding regions 108, make contact between the upper p-type epitaxial region 102 (or the p-type implant region 103, if present) and the lower p-type epitaxial region under only the red pixel locations.

Figure 1F:
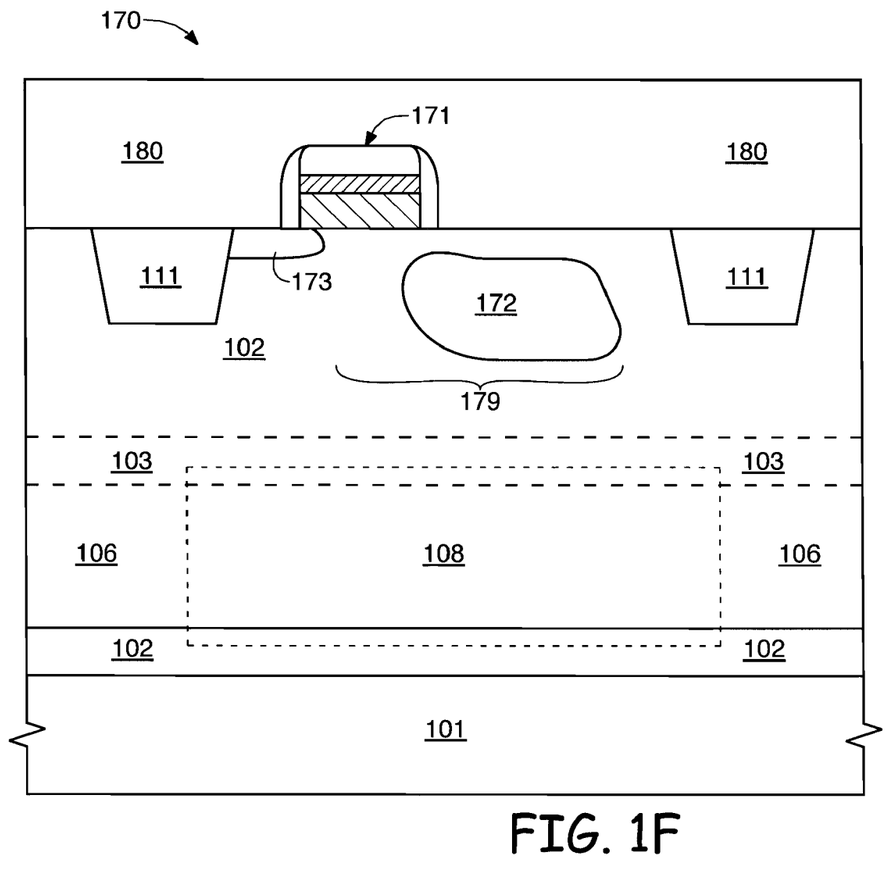
FIG. 1F illustrates a cross-sectional view of a semiconductor assembly comprising a an individual red pixel of a CMOS image sensor device in accordance with a first embodiment of the present disclosure.

FIG. 1F depicts an individual red pixel structure 170 resulting from the process steps of the first embodiment and corresponds to the cross-sectional view along line 2-2 of FIG. 1B. This view represents a red pixel formed by techniques know to one skilled the art and is meant to show the inclusion of a ground contact structure of the first embodiment. FIG. 1F shows a pinned photodiode 179 having a photosensitive p-n junction region comprising a p-type surface layer in p-type epitaxial region 102 and an n-type photodiode region 172. An optional conductive p-type region 103 also lies deep into p-type epitaxial region 102 and a deep N-Tub region 106 is formed in the p-type epitaxial region 102 below the red pixel region. A p-type conductive region 108 forms the desired grounding contact between an upper region of the p-type epitaxial region 102 and a lower region of the p-type epitaxial region 102. The conductive region 108 (or grounding contact) penetrates completely through N-Tub region 106 and preferably lies directly under the entire red pixel location. P-type grounding contact 108 will provide a low resistance to ground for stray photons from adjoining cells and thus reduce dark non-uniformity effects. The floating diffusion region 173 adjacent to the transfer gate 171, is also preferably n-type and the red pixel is isolated from neighboring structures by field oxide regions 111 and by overlaying insulating material 180 (typically a planarized translucent or transparent insulating layer, such as $SiO_2$, BPSG, PSG, BSG, or SOG).

Figure 2C:
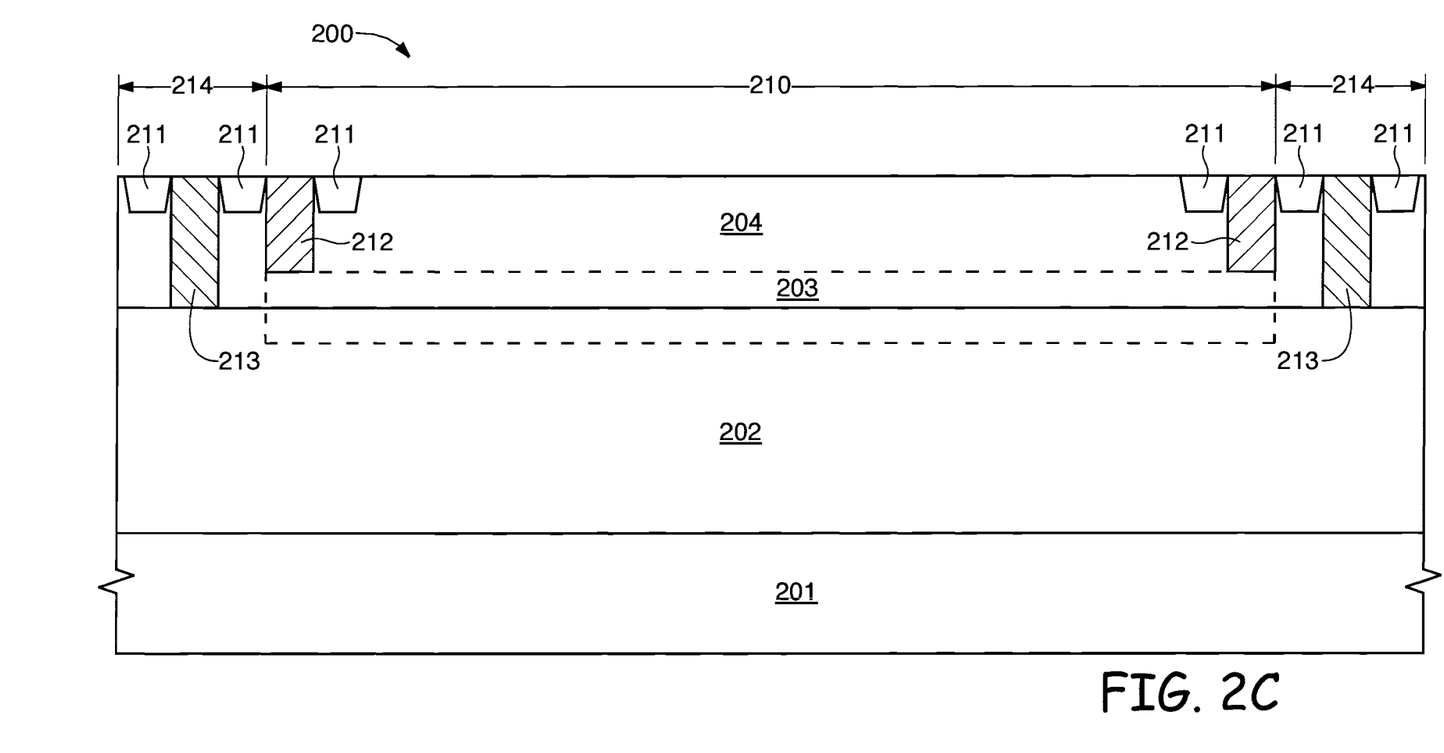
FIGS. 2C-2D illustrate cross-sectional views of a semiconductor assembly comprising a segment of a CMOS image sensor device during various stages of fabrication in accordance with a second embodiment of the present disclosure.
Figure 2D:
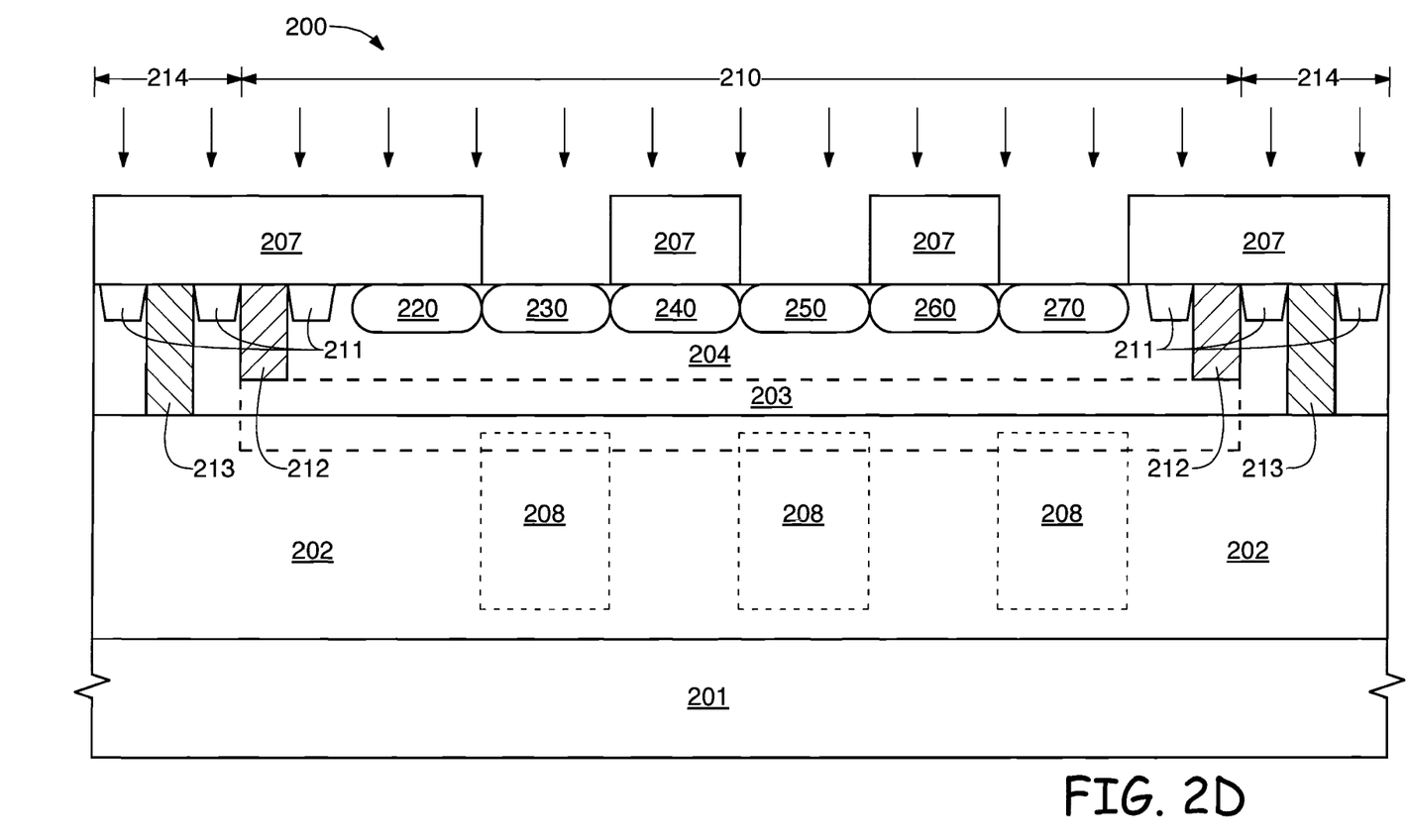

A CMOS image sensor device in accordance with a second embodiment of the present disclosure is fabricated as depicted in the cross-sectional views of FIG. 2C-2D, that correspond to the generally layout of top down view FIG. 1A and in accordance to the cross-sectional view taken along line 1-1 of FIG. 1A.

Referring now to FIG. 2C, CMOS image sensor 200 utilizes an n-type substrate section 201. An n-type epitaxial material is grown in the course of epitaxial deposition and then patterned to form n-type epitaxial region 202 on n-type substrate 201 at a thickness of approximately 4 μm and doped to a n-type conductivity using for example 4 ohms$^{-cm}$ at a concentration of approximately 1E15 atoms cm$^{-3}$.

Next, field oxide regions 211, such as by using shallow trench isolation (STI) techniques know to one skilled in the art, are formed in n-type epitaxial region 202. For example field oxide regions 211 can be formed using a conventional STI process and are typically formed by etching a trench in the substrate via a directional etching process, such as Reactive Ion Etching (RIE), or etching with a preferential anisotropic etchant. The trenches are then filled with an insulating material, for example, silicon dioxide, silicon nitride, ON (oxide-nitride), NO (nitride-oxide), or ONO (oxide-nitride-oxide). The insulating materials may be formed by various chemical vapor deposition (CVD) techniques such as low pressure chemical vapor deposition (LPCVD), high density plasma (HDP) deposition, or any other suitable method for depositing an insulating material within a trench. After the trenches are filled with an insulating material, a planarizing process such as chemical mechanical polishing is used to planarize the structure.

Following the formation of field oxide regions 211, a p-type ground ring 212 is formed inside the pixel array section 210 to form a peripheral p-well wall thereabout and extends to contact the p-type implant region 204 or to an p-type implant region 203, which is a p-type conductive region formed by an optional p-type implant. Next, an n-type sidewall (n-type guard ring) 213 is formed in the peripheral circuit region 214 that extends to the n-type epitaxial region 202 to form an n-type region isolation structure which separates the pixel array region 210 from the peripheral circuit region 214.

Referring now to FIG. 2D, implant mask 207 is patterned so that only the red pixel locations 230, 250 and 270 are open during a subsequent implant step. Next, a p-type implant is performed to create the p-type conductivity extension regions 208. The p-type implant may be performed such that the resulting p-type conductivity extension regions 208 are at approximately the same depth as the n-type epitaxial region 202. One method would be to perform the p-type implant using a high enough dose that will over compensate the n-type epitaxial region 202 under the desired red pixel. For example, using a boron dose greater than 5E12 atoms cm$^{-3}$ at an energy level of around 1.4 keV, will sufficiently punch the p-type implant into the n-type epitaxial region 202. P-type conductivity extension regions 208 will reduce floating body effects and increase the photon collection depth, which in turn improve quantum efficiency for the red pixels without increasing the fill factor (pixel density) of CMOS image sensor.

FIG. 2D also illustrates a CMOS imager sensor structure resulting from the process steps as discussed in accordance with FIGS. 2C-1D. FIG. 2D illustrates a CMOS image sensor structure of FIG. 2C depicts an n-type substrate 201, on which resides N-type epitaxial silicon region 202. An n-type peripheral sidewall (N+ guard ring) 213 is formed therein that preferably is a contiguous structure that surrounds the pixel array substrate region 210 and extends downwardly and connecting to the N-type epitaxial region 202 to electrically isolate the pixel array region 210 from the periphery regions 214.

The pixel array substrate region 210 further includes p-well implants in the form of a peripheral p-well sidewall (p-type ground ring) 212 formed around the perimeter of the pixel array substrate region 210. The p-type ground ring 212 can be either contiguous or non-contiguous, in that the p-well wall 212 may include a plurality of local p-well implants, each of which will make contact to an optional p-type implant region 203. P-type conductivity extension regions 208, make contact to the upper p-type conductive implant region 204 (or p-type implant region 203, if present) and extend into the n-type epitaxial region 202 under only the red pixel locations.

Figure 2E:
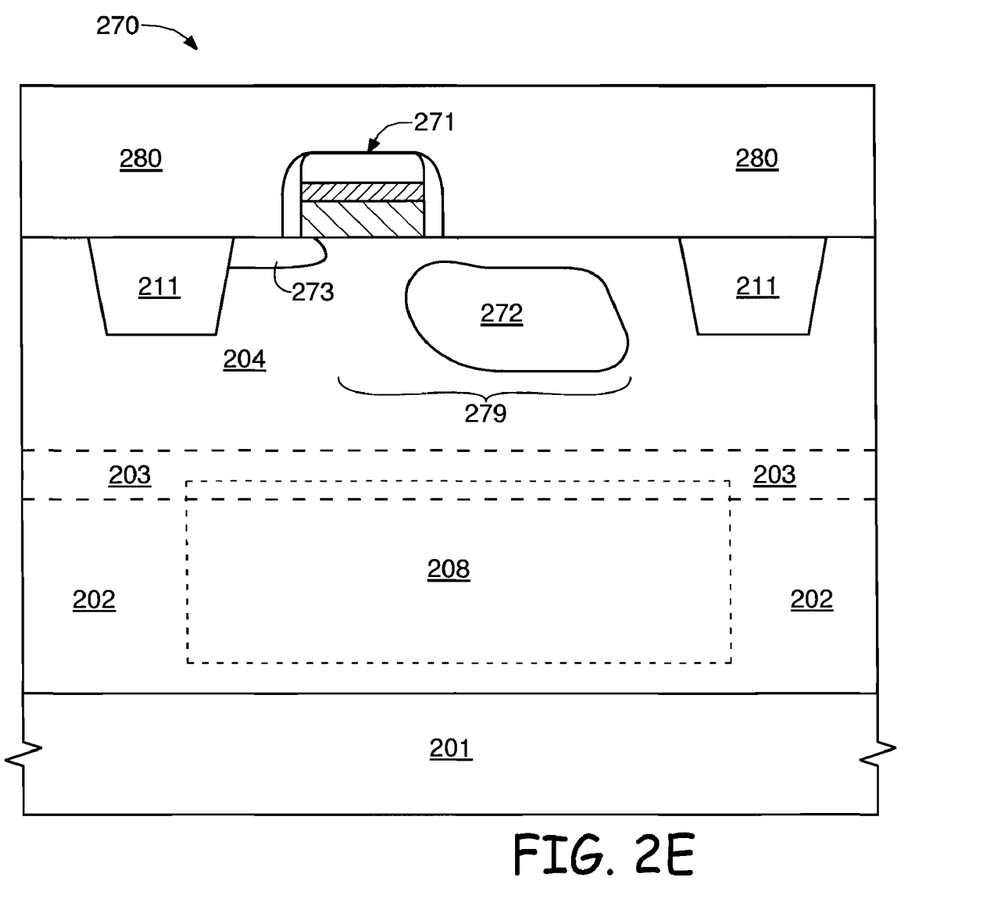
FIG. 2E illustrates a cross-sectional view of a semiconductor assembly comprising a an individual red pixel of a CMOS image sensor device in accordance with a second embodiment of the present disclosure.

FIG. 2E presents a view of a section of the individual red pixel 270 taken along line 2-2 of FIG. 1B. Referring now to FIG. 2E, a representative red pixel structure 270 is depicted in the cross-sectional view of FIG. 2E in accordance with the general top-down view of FIG. 1B. This view represents a red pixel formed by techniques know to one skilled the art and is meant to show the inclusion of a conductivity extension region structure of the present disclosure. FIG. 2E shows a pinned photodiode 279 having a photosensitive p-n junction region comprising a p-type surface layer in p-type implant region 204 and an n-type photodiode region 272. An optional conductive p-type region 203 also lies deep into p-type implant region 204. A p-type conductive extension region 208 forms the desired conductive path between an upper region of the p-type implant region 204 (or p-type region 203 if present) and into n-type epitaxial region 202. The p-type conductive extension region 208 penetrates into, if not through, n-type epitaxial region 202 and is located preferably directly under the entire red pixel location. As, previously mentioned, p-type conductivity extension regions 208 will reduce floating body effects and increase the photon collection depth, which in turn improve quantum efficiency for the red pixels without increasing the fill factor (pixel density) of CMOS image sensor. The floating diffusion region 273 adjacent to the transfer gate 271, is also preferably n-type and the red pixel is isolated from neighboring structures by field oxide regions 211 and by overlaying insulating material 280 (typically a planarized translucent or transparent insulating layer, such as $SiO_2$, BPSG, PSG, BSG, or SOG).

CMOS image sensors of the present disclosure, and described with reference to FIGS. 1C-1F and 2C-2E, may be further processed as known in the art to fabricate a CMOS image sensor device.

Figure 3:
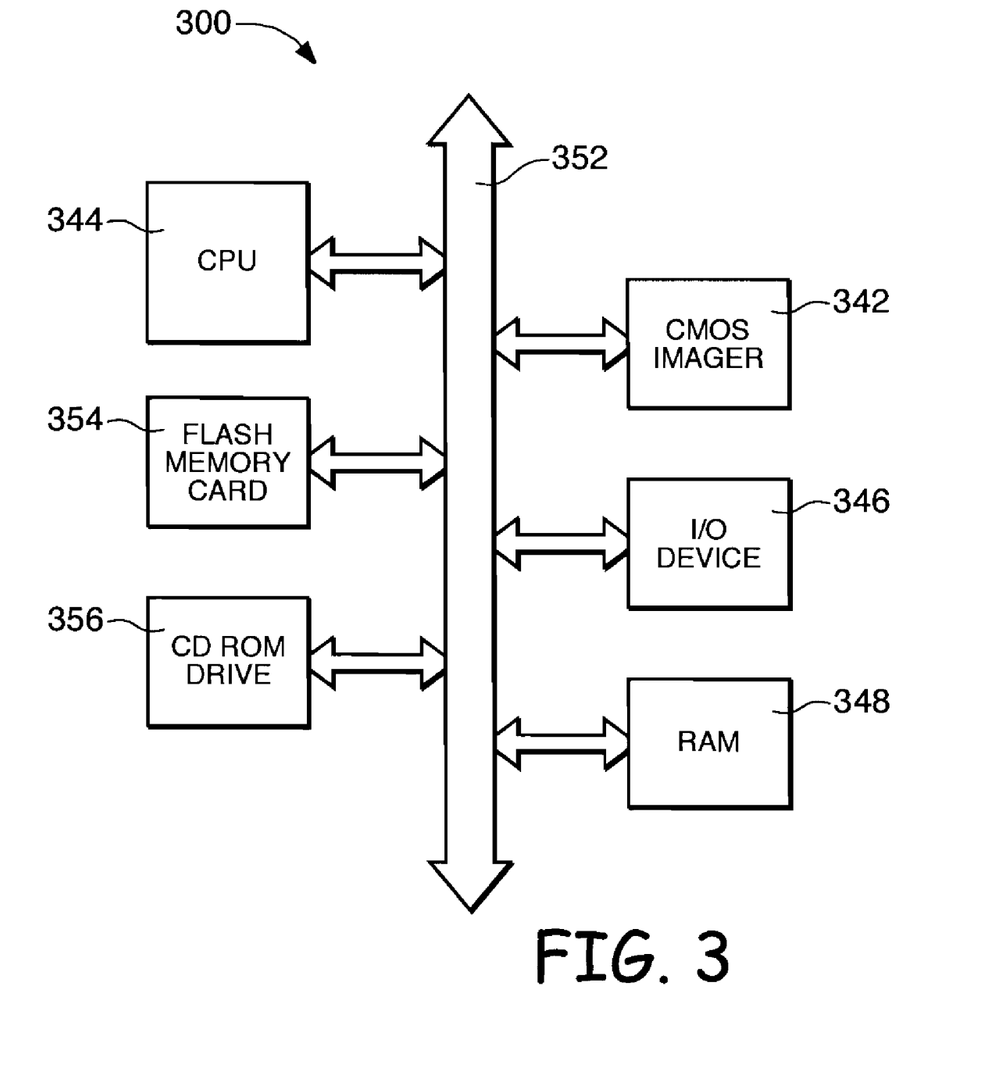
FIG. 3 represents a system used to employ any one of the embodiments of the present disclosure.

A typical processor system 300, which includes a CMOS imager 342 having a imaging sensor array formed in the manner described above according to the present disclosure, is illustrated generally in FIG. 3. Processor system 300 is exemplary of a system having digital circuits, which could include the CMOS image sensor 342. The image sensor 342 provides an image signal produced from the pixels in the pixel array. Without being limiting, such a processor system could include a computer system, camera system, scanner, machine vision, vehicle navigation, video phone, surveillance system, auto focus system, star tracker system, motion detection system, image stabilization system and data compression system for high-definition television, all of which can utilize the invention.

A processor system 300, such as a computer system, for example generally comprises a central processing unit (CPU) 344, for example, a microprocessor that communicates with an input/output (I/O) device 346 over a bus 352. The CMOS imager 342 also communicates with the system over bus 352. The computer system 300 also includes random access memory (RAM) 348, and in the case of a computer system may include peripheral devices such as a flash memory card 354, or a compact disk (CD) ROM drive 356 which also communicate with CPU 344 over the bus 352. It may also be desirable to integrate the processor 344, CMOS image sensor 342 and memory 348 on a single integrated circuit (IC) chip.

It should be noted that although the present disclosure has been described with specific reference to CMOS image sensors having a photodiode and a floating diffusion region, the invention has broader applicability and may be used in any imaging apparatus. The present disclosure has been described with reference to n-channel devices, for p-channel array devices, however all of the implants can be of a switched type. Similarly, the processes described above are exemplary of many methods that could be used. The above description and drawings illustrate preferred embodiments are not intended to limit the present disclosure to the illustrated embodiments and any modification thereof which comes within the spirit and scope of the following claims.

What is claimed is:

1. A CMOS image sensor structure comprising:
   a p-type substrate underlying a pixel array region and a peripheral region, the p-type substrate having a p-type substrate region and a p-type epitaxial region;
   an n-type region (N-Tub region) having an n-type peripheral sidewall (N+ guard ring) within the p-type epitaxial region, the N-Tub region extending under the pixel array region and below field oxide regions which surround the pixel array region, the pixel array region enclosed by a peripheral p-well sidewall (p-type ground ring), the p-type ground ring extending below the field oxide regions and providing an electrical connection to the p-type epitaxial region, wherein the pixel array region has a plurality of pixels including red pixels, green pixels, and blue pixels; and
   p-type conductive implant regions that electrically connect the p-type epitaxial region to the p-type substrate through the N-Tub region at each red pixel location, wherein each of the red pixels in the plurality of pixels is located above a corresponding one of the p-type conductive implant regions, wherein only the red pixels are located above the p-type conductive implant regions, and wherein the green pixels and the blue pixels are not located above any of the p-type conductive implant regions.

2. The CMOS image sensor structure of claim 1, wherein the N+ guard ring is a contiguous structure that surrounds the pixel array region and extends downwardly to the N-Tub region.

3. The CMOS image sensor of claim 1, wherein the N+ guard ring isolates the p-type epitaxial region from the p-type substrate and provides an electrical connection to the N-Tub region.

4. The CMOS image sensor structure of claim 1, wherein the p-type ground ring is either a contiguous or non-contiguous structure that connects the p-type epitaxial to a given potential.

5. A CMOS image sensor structure comprising:
   at least one red pixel structure having a n-type photodiode region residing within a p-type epitaxial region;
   at least one green pixel structure;
   at least one blue pixel structure;
   an N-Tub region residing in the p-type epitaxial region below each red pixel location; and
   at least one p-type conductive implant region extending through the N-Tub region and connecting the p-type epitaxial region bordering a first surface of the N-Tub region to the p-type epitaxial region bordering a second surface the N-Tub region, wherein the at least one red pixel structure is located above the at least one p-type conductive implant region, wherein only the at least one red pixel structure is located above the at least one p-type conductive implant region, and wherein the at least one green pixel structure and the at least one blue pixel structure are not located above the at least one p-type conductive implant region.

6. The CMOS image sensor structure of claim 5 further comprising a second p-type conductive implant region separating the N-Tub region from the red pixel structure.

7. The CMOS image sensor structure of claim 5 further comprising a pinned photodiode having a photosensitive p-n junction region comprising a p-type surface layer and an n-type photodiode region.

8. The CMOS image sensor structure of claim 5 further comprising:
   a floating diffusion region adjacent to an n-type conductive transfer gate;
   each red pixel structure isolated from neighboring pixel structures by field oxide regions and by overlaying insulating material, the insulating material being a translucent or transparent insulating layer.

9. The CMOS image sensor structure of claim 8, wherein the translucent or transparent insulating material is a material selected from the group consisting essentially of $SiO_2$, BPSG, PSG, BSG, or SOG.

10. An integrated circuit comprising: a semiconductor substrate having a pixel array region and a peripheral circuit region, the semiconductor substrate comprising:
   a p-type substrate underlying a pixel array region and a peripheral region, the p-type substrate having a p-type substrate region and a p-type epitaxial region;
   a deep n-type region (N-Tub region) having an n-type peripheral sidewall (N+ guard ring) within the p-type substrate, such that at least in the pixel array region, the N-Tub region is sandwiched between the p-type substrate region and a p-type epitaxial region and an upper p-type polysilicon region, the N-Tub region extending under the pixel array region and below field oxide regions which surround the pixel array region, the pixel array region enclosed by a peripheral p-well sidewall (p-type ground ring), the p-type ground ring extending below the field oxide regions and within the p-type polysilicon region and provides an electrical connection to the p-type epitaxial region; and
   p-type conductive implant regions that connect the p-type epitaxial region to the p-type substrate through the N-Tub region, wherein the pixel array region has a plurality of pixels including red pixels, green pixels, and blue pixels, wherein each of the red pixels in the plurality of pixels is located above a corresponding one of the p-type conductive implant regions, wherein only the red pixels are located above the p-type conductive implant regions, and wherein the green pixels and the blue pixels are not located above any of the p-type conductive implant regions.

11. The integrated circuit of claim 10, wherein the N+ guard ring is a contiguous structure that surrounds the pixel array region and extends downwardly to the N-Tub region.

12. The integrated circuit of claim 10, wherein the N+ guard ring isolates the p-type epitaxial region and an upper p-type polysilicon region from the p-type substrate and provides an electrical connection thereto.

13. The integrated circuit of claim 10, wherein the p-type ground ring is either a contiguous or non-contiguous structure that connects the p-type epitaxial to a given potential.

14. A processing system comprising: (i) a processor; and (ii) an imaging device coupled to the processor, the imaging device containing an image sensor which comprises:
   a p-type substrate underlying a pixel array region and a peripheral region, the p-type substrate having a p-type substrate region and a p-type epitaxial region;
   an n-type region (N-Tub region) having an n-type peripheral sidewall (N+ guard ring) within the p-type epitaxial region, the N-Tub region extending under the pixel array region and below field oxide regions which surround the pixel array region, the pixel array region enclosed by a peripheral p-well sidewall (p-type ground ring), the p-type ground ring extending below the field oxide regions and within and providing an electrical connection to the p-type epitaxial region, wherein the pixel array region has a plurality of pixels including red pixels, green pixels, and blue pixels; and
   p-type conductive implant regions that connect the p-type epitaxial region to the p-type substrate through the N-Tub region at the red pixel locations, wherein the red pixels are located above corresponding p-type conductive implant regions, wherein only the red pixels are located above the p-type conductive implant regions, and wherein the green pixels and the blue pixels are not located above the p-type conductive implant regions.

15. The processing system of claim 14 further comprising a second p-type conductive implant region separating the N-Tub region from the red pixel locations.

16. The processing system of claim 14, wherein the N+ guard ring is a contiguous structure that surrounds the pixel array region and extends downwardly to the N-Tub region.

17. The processing system of claim 14, wherein the N+ guard ring isolates the p-type epitaxial region from the p-type substrate and provides an electrical connection to the N-Tub region.

18. The processing system of claim 14, wherein the p-type ground ring is either a contiguous or non-contiguous structure that connects the p-type epitaxial to a given potential.

19. A CMOS image sensor structure comprising:
   an n-type substrate underlying a pixel array region and a peripheral region, the n-type substrate having an n-type substrate region with an n-type epitaxial region;
   an n-type peripheral sidewall (N+ guard ring) arranged such that at least in the pixel array region, the n-type epitaxial region underlies a p-type conductive region, the n-type epitaxial region extending under the pixel array region and below surrounding field oxide regions, the pixel array region enclosed by a peripheral p-well sidewall (p-type ground ring), the p-type ground ring extending below the field oxide regions and within the p-type conductive region so as to provide an electrical connection to the p-type conductive region, wherein the pixel array region has a plurality of pixel structures including red pixel structures, green pixel structures, and blue pixel structures; and
   p-type conductivity extension regions that connect to the p-type conductive region of the red pixel structures and extend into the n-type epitaxial region, wherein the red pixel structures are located above corresponding p-type conductivity extension regions, wherein only the red pixel structures are located above the p-type conductivity extension regions, and wherein the green pixel structures and the blue pixel structures are not located above the p-type conductivity extension regions.

20. The CMOS image sensor structure of claim 19 further comprising a second p-type conductive implant region separating the n-type epitaxial region from the red pixel structures.

21. The CMOS image sensor structure of claim 19, wherein the N+ guard ring is a contiguous structure that surrounds the pixel array region and extends downwardly to the n-type epitaxial region.

22. The CMOS image sensor structure of claim 19, wherein the N+ guard ring isolates the p-type conductive region from the n-type epitaxial region and provides an electrical connection thereto.

23. The CMOS image sensor structure of claim 19, wherein the p-type ground ring is either a contiguous or non-contiguous structure that connects the p-type conductive region to a given potential.

24. A CMOS image sensor structure comprising:
at least one red pixel structure residing within a p-type conductive region overlying an n-type epitaxial region;
at least one green pixel structure;
at least one blue pixel structure; and
at least one p-type conductive implant region connecting to the p-type conductive region and extending into the n-type epitaxial region, wherein the at least one red pixel structure is located above the at least one p-type conductive implant region, wherein only the at least one red pixel structure is located above the at least one p-type conductive implant region, and wherein the at least one green pixel structure and the at least one blue pixel structure are not located above the at least one p-type conductive implant region.

25. The CMOS image sensor structure of claim 24 further comprising a second p-type conductive implant region separating the n-type epitaxial region from the at least one red pixel structure.

26. The CMOS image sensor structure of claim 24 further comprising a pinned photodiode having a photosensitive p-n junction region comprising a p-type surface layer and an n-type photodiode region.

27. The CMOS image sensor structure of claim 24 further comprising:
a floating diffusion region adjacent to an n-type conductive transfer gate;
each red pixel structure isolated from neighboring pixel structures by field oxide regions and by overlaying insulating material, the insulating material being a translucent or transparent insulating layer.

28. The CMOS image sensor structure of claim 27, wherein the translucent or transparent insulating material is a material selected from the group consisting essentially of $SiO_2$, BPSG, PSG, BSG, or SOG.

29. An integrated circuit comprising: a semiconductor substrate having a pixel array region and a peripheral circuit region, the semiconductor substrate comprising;
an n-type substrate underlying a pixel array region and a peripheral region, the n-type substrate having an n-type substrate region with an n-type epitaxial region;
an n-type peripheral sidewall (N+ guard ring) arranged such that at least in the pixel array region, the n-type epitaxial region underlies a p-type conductive region, the n-type epitaxial region extending under the pixel array region and below surrounding field oxide regions, the pixel array region enclosed by a peripheral p-well sidewall (p-type ground ring), the p-type ground ring extending below the field oxide regions and within the p-type conductive region so as to provide an electrical connection to the p-type conductive region, wherein the pixel array region has a plurality of pixel structures including red pixel structures, green pixel structures, and blue pixel structures;
p-type conductivity extension regions that connect to the p-type conductive region of the red pixel structures and extend into the n-type epitaxial region, wherein the red pixel structures are located above corresponding p-type conductivity extension regions, wherein only the red pixel structures are located above the p-type conductivity extension regions, and wherein the green pixel structures and the blue pixel structures are not located above the p-type conductivity extension regions.

30. The integrated circuit of claim 29 further comprising a second p-type conductive implant region separating the N-Tub region from the red pixel structures.

31. The integrated circuit of claim 29, wherein the N+ guard ring is a contiguous structure that surrounds the pixel array region and extends downwardly to the n-type epitaxial region.

32. The integrated circuit of claim 29, wherein the N+ guard ring isolates the p-type conductive region from the n-type epitaxial region and provides an electrical connection thereto.

33. The integrated circuit of claim 29, wherein the p-type ground ring is either a contiguous or non-contiguous structure that connects the p-type conductive region to a given potential.

34. A processing system comprising: (i) a processor; and (ii) an imaging device coupled to the processor, the imaging device containing an image sensor which comprises:
an n-type substrate underlying a pixel array region and a peripheral region, the n-type substrate having an n-type substrate region with an n-type epitaxial region;
an n-type peripheral sidewall (N+ guard ring) arranged such that at least in the pixel array region, the n-type epitaxial region underlies a p-type conductive region, the n-type epitaxial region extending under the pixel array region and below surrounding field oxide regions, the pixel array region enclosed by a peripheral p-well sidewall (p-type ground ring), the p-type ground ring extending below the field oxide regions and within the p-type conductive region so as to provide an electrical connection to the p-type conductive region;
p-type conductivity extension regions that connect to the p-type conductive region of red pixel structures and extend into the n-type epitaxial region, wherein the pixel array region has a plurality of pixels including red pixels, green pixels, and blue pixels, wherein the red pixels are located above corresponding p-type conductivity extension regions, wherein only the red pixels are located above the p-type conductivity extension regions, and wherein the green pixels and the blue pixels are not located above the p-type conductivity extension regions.

35. The processing system of claim 34 further comprising a second p-type conductive implant region separating the N-Tub region from the red pixel structures.

36. The processing system of claim 34, wherein the N+ guard ring is a contiguous structure that surrounds the pixel array region and extends downwardly to the n-type epitaxial region.

37. The processing system of claim 34 wherein the N+ guard ring isolates the p-type conductive region from the n-type epitaxial region and provides an electrical connection thereto.

38. The processing system of claim 34 wherein the p-type ground ring is either a contiguous or non-contiguous structure that connects the p-type conductive region to a given potential.

* * * * *